United States Patent [19]

Kullen et al.

[11] 4,301,232
[45] Nov. 17, 1981

[54] METHOD OF PRODUCING CONTINUOUS TONE GRADATION PRINTS

[76] Inventors: Allan S. Kullen, 7723 Groton Rd., Bethesda, Md. 20034; Phillip Ratner, 10008 Hall Rd., Potomac, Md. 20854

[21] Appl. No.: 161,594

[22] Filed: Jun. 20, 1980

Related U.S. Application Data

[63] Continuation-in-part of Ser. No. 94,786, Nov. 16, 1979, abandoned.

[51] Int. Cl.$^3$ .................................................. G03C 5/00
[52] U.S. Cl. .......................................... 430/300; 430/4; 430/396; 430/957; 101/170; 101/211; 101/466; 101/450.1; 355/78; 355/85; 427/271; 427/272
[58] Field of Search ..................... 430/4, 7, 396, 951, 430/300; 427/164, 162, 271, 272; 101/170, 211, 466, 450; 355/78, 85

[56] References Cited

U.S. PATENT DOCUMENTS

| | | | |
|---|---|---|---|
| 1,120,913 | 12/1914 | Dodge | 430/951 X |
| 1,128,436 | 2/1915 | Freer | 101/463.1 |
| 1,651,011 | 11/1927 | Adams | 101/451 |
| 1,961,927 | 6/1934 | Gerking | 430/302 |
| 2,122,404 | 7/1938 | Bloom | 430/302 |
| 2,301,770 | 11/1942 | Bassist | 430/15 |
| 2,304,541 | 12/1942 | Cator | 101/462 |
| 2,345,477 | 11/1944 | Bassist | 33/418 |
| 2,739,080 | 3/1956 | Woodworth | 427/164 X |
| 2,957,791 | 10/1960 | Bechtold | 428/220 |
| 3,334,584 | 8/1967 | Sites | 101/456 |
| 3,581,660 | 6/1971 | Rapoport et al. | 101/450 |
| 3,595,651 | 7/1971 | Luig | 430/4 X |
| 3,901,151 | 8/1975 | Crystal | 101/463 |
| 3,961,955 | 6/1976 | Gracia et al. | 101/450 X |
| 4,011,085 | 3/1977 | Rapoport et al. | 101/450 X |

OTHER PUBLICATIONS

Mertle et al., Practical Information on Plate Making and Presswork by Recognized Procedures, 1957 pp. 10, 13, 15, 22, 23, 90-97, 105-106, 121-123, 278-280, 290 and 300-302.

Cartwright, "Graphic Arts Manual, vol. I, Photoengraving", 5/63, pp. 29, 37-43.

*Primary Examiner*—Jack P. Brammer
*Attorney, Agent, or Firm*—Armstrong, Nikaido, Marmelstein & Kubovcik

[57] ABSTRACT

A method for producing prints having continuous tone gradation which includes the steps of selectively placing solvents on a semi-opaque substrate having a surface altering the surface of the substrate enabling the substrate to hold a colorant, placing colorant on the areas of the substrate so treated, thereby producing continuous tone gradations, transferring an image of the continuous tone gradation substrate onto a conventional print plate and printing prints from the print plate. The steps of transferring can be done either by direct contact printing or by an intermediate conventional negative. The most preferred embodiment includes ethyl alcohol as the solvent, cellulose acetate as the substrate and india ink as the colorant. Multicolor prints can be made from varying density print plates produced by differing exposure times of transferring the image and overprinting the plates using differing inks.

52 Claims, No Drawings

METHOD OF PRODUCING CONTINUOUS TONE GRADATION PRINTS

BACKGROUND OF THE INVENTION

This is a continuation-in-part of application Ser. No. 94,786, filed Nov. 16, 1979, now abandoned.

This invention relates to lithography and, more particularly, to a method of producing continuous tone gradation prints from an original artwork.

Various processes are known in the art for producing lithographic prints. These processes all include printing utilizing a plate or surface which has first areas to be reproduced which accept ink to be transferred and second areas which are not to be reproduced which reject ink, thus providing differently inked areas for the final print.

Difficulties are encountered when any artwork other than fine line illustrations are attempted to be printed. Shadow areas (any tone other than black or white) cannot really exist in a line drawing and are only "optically" visible because of the artist's skill in varying the width of the lines, as well as the spacing between them.

Various other methods of obtaining a tonal gradation which "optically" appears to be continuous have been developed.

The vast majority of these methods to produce an "optically" continuous tone gradation in an ultimate print involve the utilization of a screen. As noted in U.S. Pat. No. 1,128,436, U.S. Pat. No. 3,581,660 and U.S. Pat. No. 4,011,085, printing plates can be produced from photographic negatives obtained by exposing an original artwork through a screen having different light disruptive patterns onto a photosensitive material. The basic half-tone process includes photographing the original artwork through a screen having a regular grid pattern of transparent areas of openings defined by opaque lines. This produces a negative divided into very fine dots of practically uniform size. A print from this negative is then transferred upon a sensitized master plate which can be utilized for direct printing or for off-set printing. The print is composed of areas of varying densities of uniform very fine dark dots.

In addition to a screen of a regular grid pattern, other screens are known in the art. Generally, process utilizing such screens include dual printing steps, each done with a printing plate made from a master and a secondary negative, respectively. The screen used to make the master negative can be a conventional regular grid screen, while the screen used for the secondary negative is a random pattern contact-exposed screen. Alternatively, the secondary negative can be a direct print of the original artwork. Further, the screen which is interposed between the artwork and the negative can have a random pattern, a stippled surface, a granular surface or other types of irregular or textured surface. The results of these processes are prints which "optically" appear to have continuous tone gradations. However, upon examination, generally under magnification, the print can be seen to be composed of minute dots. Generally, in very light tonal areas, the dots are very small and are surrounded by a relatively large area of white. In darker areas, the dots are larger and have less white space between them. In very dense, dark areas, the print will appear to be a solid area, speckled unevenly with a few white dots of varying sizes.

Thus, when utilizing conventional photolithographic printing plates, the above-noted prior art produces a very carefully created copy, but one which is, in fact, a photographically altered reproduction of the original artwork.

Other methods of producing continuous tone gradation prints have been developed and are known. All of these methods involve the use of specially prepared printing plates and do not utilize standard, conventional, commercially available plates. For example, U.S. Pat. No. 2,345,447 discloses the direct shooting of light through a negative to a plate having a special coating which subsequently must be heated to produce tiny dots by the reticulation of the gelatin on the plate so that continuous tone prints may be made therefrom. U.S. Pat. No. 2,122,404 relies on the particular coating on the plate to produce the detail required. U.S. Pat. No. 3,961,955 requires a physically roughened support on a metal plate to carry the photographically sensitive material which ultimately becomes the image on the plate. As noted in this patent, it is believed that the physically roughened surface of the plate acts similarly to a screen to break up the metal image on the plate into a dot pattern and preferably into a very fine random dot pattern which gives the illusion of continuous tones. Consequently, these prior art methods require the use of specially prepared printing plates which are not commercially available.

Various methods for making a negative or a positive to be transferred onto a printing plate are known. For example, U.S. Pat. No. 2,301,770 teaches a method for producing a negative which comprises coating a sheet of translucent flexible material with a hydrophilic layer, a water soluble layer, a printed layer and a photosensitive layer. Straight light is shot through the printed layer to the photosensitive layer. The photosensitive layer ultimately only adheres where the printed layer is not. The printed material thereafter is washed away, leaving a hard negative which can thereafter be printed on a standard printing plate. A very unusual method of preparing a negative for a lithographic plate is disclosed in U.S. Pat. No. 2,957,791. This patent concerns a particular polymer material which is normally opaque. Thus, when such a polymer material sheet is placed in a typewriter, typing without a ribbon produces clear letters on an opaque background. Thus, a negative for a lithographic plate can simply be prepared from typewriting, handwriting or line drawing. There is no teaching in this reference of any way of making a continuous tone gradation. Thus, none of the prior art contains any simple, inexpensive method of producing an original artwork which is simply and easily transferred to a standard, commercially available printing plate.

OBJECTS AND SUMMARY OF THE INVENTION

It is an object of the present invention to provide a method of producing an original artwork which is easily transferred to a printing plate. It is a further object of the present invention to provide a method wherein an original artwork can be created on readily available commercial material and thereafter transferred to a printing plate.

It is still a further object of the present invention to provide a method for producing an original artwork wherein the artist can directly duplicate the work via a lithographic process.

Another object of the present invention is to provide a method of printing wherein an original artwork having continuous tone gradations can be produced without the use of photographic screens or specialty printing plates.

Yet another object of the present invention is to provide a method of printing wherein an original artwork having continuous tone gradations and multiple colors and tones can be produced without mechanical or photographic alterations.

Accordingly, the present invention is a method of producing prints having continuous tone gradations which comprises (a) selectively placing solvent on a semi-opaque substrate having a surface wherein the surface of the substrate is altered such that the substrate is able to hold a colorant, (b) placing colorant on the areas of the substrate which were treated above prior to the solvent evaporating, thereby producing continuous tone gradations, (c) transferring an image of the continuous tone gradation substrate produced above onto a conventional print plate, and (d) printing a print from the print plate.

Alternatively, steps (a) and (b) can be reversed or combined. Specifically, step (a) can be: selectively placing a colorant on a semi-opaque substrate having a surface, followed by step (b): placing a solvent on the areas of the substrate which were treated in step (a) prior to the colorant drying wherein the surface of the substrate is altered such that the substrate is able to hold the colorant, thereby producing continuous tone gradations. In combination, step (a) can be: mixing a colorant and a solvent, followed by step (b): selectively placing the mixture on a semi-opaque substrate having a surface wherein the surface of the substrate is altered such that the substrate is altered such that the substrate is able to hold the colorant, thereby producing continuous tone gradations.

When the solvent and the colorant are placed separately, it is critical for producing continuous tone gradations that the second be placed on the areas treated by the first before the first has dried or evaporated.

An opaque pattern can be produced on the substrate prior to, or following, the steps for producing the continuous tone gradations. The opaque pattern can include a line drawing, printed matter or the like.

The step of transferring the image from the continuous tone gradation substrate to the print plate can be either by contact printing the continuous tone gradation substrate onto the print plate, or by contact printing the continuous tone gradation substrate onto a photosensitive transparent second substrate to produce a negative and then contacting printing the negative onto the print plate.

The capability of producing multiple colors or color tone variations from the continuous tone gradation substrate is present in the step of transferring. Differently timed exposures of the continuous tone gradation substrate produce separate contact printed print plates or separate negatives and subsequent print plates of varying densities. Because of the continuous tone gradations of the continuous tone gradation substrate, overprinting with different inks of the varying density print plates on the final print generates multiple colors or tones of the same color. No photographic alterations of the substrate, such as imposition of screens or cutting are utilized. No mechanical alterations of the substrate, such as masking or painting out are utilized. Multiple colors or color tone variations are simply made by use of prints made from differently timed exposures of the continuous tone gradation substrate.

The solvent can be selected from any particular solvent which alters the surface of the substrate chosen such that the substrate is able to hold the colorant chosen. The use of a solvent is critical to the present invention, since without it the colorant will simply bead up on the substrate and not produce continuous tone gradations. For example, the solvent can be an alcohol or an ether or water. The alcohol which is chosen can include methyl, ethyl, propyl, isopropyl, n-butyl, sec-butyl, iso-butyl, tert-butyl and benzyl. The most preferred alcohol is ethyl.

The substrate is preferably a plastic. The plastic can be selected from the group consisting of cellulose acetate, polypropylene, polyethylene, polystyrene, polymethylmethacrylate and polyphenyl. The important criteria for the selection of the substrate is that it is semi-opaque, it can be altered by a solvent so as to be able to hold a colorant, and be strong enough to withstand the normal physical handling such that a print plate can be prepared from it. Most preferably, the plastic is cellulose acetate which has been frosted.

The thickness of the substrate is selected so that sufficient light can pass therethrough to produce a proper print plate or negative. Preferably, the thickness is less than or equal to 0.010 inches. Most preferably, when cellulose acetate is used, the thickness should be 0.005 inches.

Many different colorants are usable in the present invention. Ink is the most readily available. India ink, as it is commonly known in the printing arts, is the most preferred colorant when ethyl alcohol is the solvent and the substrate is cellulose acetate. India ink is a permanent black ink made of lampback and blue binder.

Many of the inks which are commercially made for use on cellulose acetate are not operative in the present invention. India ink is particularly well suited for carrying the solvent into the substrate.

DETAILED DESCRIPTION OF PREFERRED EMBODIMENTS

As non-limiting examples of preferred embodiments of the present invention, several sheets of readily-available, commercial cellulose acetate are cut to the size desired. The sheets of cellulose acetate are frosted on one side. A line drawing is drawn on the cellulose acetate on either side, utilizing india ink. A sufficient time period is given to enable this india ink to dry on the surface of the cellulose acetate. For example, such a period of time would be approximately ½ hour.

Thereafter, in a first example, solvent is dripped or brushed onto the frosted side of the cellulose acetate. The preferred solvent is ethyl alcohol. India ink either mixed with water or taken straight is then dropped or brushed onto the solvated frosted side of the cellulose acetate before the alcohol has evaporated. This gives an ink-wash effect similar to that of a water color or an ink-wash drawing. This produces the continuous tone gradations. The solvent is permitted to evaporate, thereby leaving the ink wash on or in the surface of the cellulose acetate. The ink-wash effect can be superimposed over the line drawing. It can even obscure part of the drawing if desired.

In a second example, the india ink is selectively dropped, brushed or lined onto the frosted side of the cellulose acetate. Solvent, preferably ethyl alcohol, is then dropped or brushed onto the ink before it has dried. This gives an ink-wash effect producing continuous tone gradations. The alcohol is permitted to evaporate, thereby leaving the ink wash on or in the surface of the acetate. Similar to the first example, the ink-wash effect can be superimposed over the line drawing and can even obscure part of the drawing.

In a third example, the india ink is mixed with a solvent, preferably ethyl alcohol. Thereafter, the mixture is dropped or brushed or otherwise applied to the frosted surface of the cellulose acetate. This gives an ink-wash effect producing continuous tone gradations. The alcohol is permitted to evaporate, thereby leaving the ink wash on or in the surface of the acetate.

The thus produced artwork is then either contact printed in a conventional manner onto a conventional printing plate having a photosensitive surface or, alternatively, the original artwork on the cellulose acetate can be contact printed onto a conventional photographic negative and, thereafter, the negative printed onto a conventional photosensitive printing plate. These conventional processes can be found in *Photomechanics and Printing,* by J. S. Mertle and G. M. Monsen, 1957.

The printing plate is conventionally developed and placed onto a press. The press can either be a direct printing press or an offset printing press utilizing a blanket. This procedure can also be found in the above-noted reference. These prints are ultimately printed on the press and are produced having continuous tone gradation equivalent to, and identical to, the continuous tone gradation produced on the cellulose acetate substrate. No specialty printing plates are necessary, no specialty materials are necessary to produce the artwork and no photographic screens are utilized producing a series of dots. Thus, the prints which are produced are exact duplicates of the original artwork excluding, of course, the material.

In order to produce a multi-color print or a print with wider color tone variations, the above produced original artwork can be contact printed onto a plurality of conventional printing plates using differing exposure times for each. Alternatively, the original artwork can be contact printed onto a plurality of conventional photographic negatives using differing exposure times for each and, thereafter, the negatives printed onto conventional photosensitive printing plates. The printing plates thus produced vary in density of continuous tone gradation image. The plates are successively placed onto a press whereupon differing inks are used to produce a mutli-color print from the different density plates. An example of typical exposures times is four negatives prepared from one artwork by being exposed to light in a contact printer for 12, 18, 23 and 40 seconds, respectively. The negatives are conventionally developed. Four conventional photosensitive printing plates are produced in the conventional manner from the four negatives. Each plate is placed on a press and one run with one color ink is made. A second, third and fourth run is made with differing inks on the same print in a conventional manner. Thus, a multicolored print is produced having continuous tone gradations without mechanical or photographic alteration of the original.

It is readily apparent that the above described methods meet all of the objects mentioned above and also have the advantage of wide commercial utility. It should be understood that the specific form of the invention hereinabove described is intended to be representative only, as certain modifications within the scope of these teachings will be apparent to those skilled in the art of lithographic reproduction.

Accordingly, reference should be made to the following claims in determining the full scope of the invention.

What is claimed:

1. A method of producing prints having continuous tone gradations comprising:
   (a) selectively placing solvent on a semi-opaque substrate having a surface wherein the surface of the substrate is altered such that the substrate is able to hold a colorant;
   (b) placing colorant on the areas of the substrate treated in step (a) prior to the solvent evaporating, thereby producing continuous tone gradations;
   (c) transferring an image of the continuous tone gradation substrate of step (b) without interposition of a screen onto a print plate; and
   (d) printing prints from the print plate.

2. A method according to claim 1 wherein step (c) comprises contact printing the continuous tone gradation substrate of step (b) onto the print plate.

3. A method according to claim 1 wherein step (c) comprises contact printing the continuous tone gradation substrate of step (b) onto a photosensitive transparent second substrate to produce a negative and contact printing the negative onto the print plate.

4. A method according to one of claims 2 or 3 wherein the solvent is selected from the group consisting of an alcohol and an ether.

5. A method according to claim 4 wherein the alcohol is selected from the group consisting of methyl, ethyl, propyl, isopropyl, n-butyl, sec-butyl, iso-butyl, tert-butyl and benzyl.

6. A method according to one of claims 2 or 3 wherein the substrate is a plastic selected from the group consisting of cellulose acetate, polypropylene, polyethylene, polystyrene, polymethylmethacrylate and polyphenol.

7. A method according to claim 6 wherein the plastic is cellulose acetate frosted on at least one side and is up to 0.010 inches thick.

8. A method according to claim 1 wherein the colorant is india ink.

9. A method according to any one of claims 2 or 3 wherein the solvent is ethyl alcohol, the substrate is frosted cellulose acetate which is 0.005" thick, and the colorant is india ink.

10. A method according to claim 1 further comprising, before step (a), producing an opaque pattern on said substrate, whereupon subsequent steps (a) and (b) produce continuous tone gradations superimposed over the opaque pattern.

11. A method according to claim 1 further comprising, between steps (b) and (c), producing an opaque pattern on the substrate whereupon the opaque pattern is superimposed over the continuous tone gradations.

12. A method according to any one of claims 10 or 11 wherein the opaque pattern is a line drawing.

13. A method according to any one of claims 2 or 3 wherein step (c) further comprises contact printing the continuous tone substrate of step (b) onto a plurality of print plates, each being printed with a different exposure time, and wherein step (d) further comprises printing prints from the plurality of prints produced in step (c) by overprinting each print with each of the plates so produced using differing inks.

14. A method according to claim 13 wherein the solvent is ethyl alcohol, the substrate is frosted cellulose acetate which is 0.005" thick and the colorant is india ink.

15. A method according to any one of claims 10 or 11 wherein step (c) further comprises contact printing the continuous tone substrate of step (b) onto a plurality of print plates, each being printed with a different exposure time, and wherein step (d) further comprises printing prints from the plurality of prints produced in step (c) by overprinting each print with each of the plates so produced using differing inks.

16. A method according to claim 15 wherein the opaque pattern is a line drawing.

17. A method of producing prints having continuous tone gradations comprising:
   (a) selectively placing a colorant on a semi-opaque substrate having a surface;
   (b) placing solvent on the areas of the substrate treated in step (a) prior to the colorant drying wherein the surface of the substrate is altered such that the substrate is able to hold the colorant, thereby producing continuous tone gradations;
   (c) transferring an image of the continuous tone gradation substrate of step (b) without interposition of a screen onto a print plate; and
   (d) printing prints from the print plate.

18. A method according to claim 17 wherein step (c) comprises contact printing the continuous tone gradation substrate of step (b) onto the print plate.

19. A method according to claim 17 wherein step (c) comprises contact printing the continuous tone gradation substrate of step (b) onto a photosensitive transparent second substrate to produce a negative and contact printing the negative onto the print plate.

20. The method according to claims 18 or 19 wherein the solvent is selected from the group consisting of an alcohol and an ether.

21. A method according to claim 20 wherein the alcohol is selected from the group consisting of methyl, ethyl, propyl, isopropyl, n-butyl, sec-butyl, iso-butyl, tert-butyl and benzyl.

22. A method according to claim 21 wherein the alcohol is ethyl.

23. A method according to one of claims 18 or 19 wherein the substrate is a plastic selected from the group consisting of cellulose acetate, polypropylene, polyethylene, polystyrene, polymethylmethacrylate and polyphenol.

24. A method according to claim 23 wherein the plastic is cellulose acetate frosted on one side and is up to 0.010 inches thick.

25. A method according to claim 17 wherein the colorant is ink.

26. A method according to any one of claims 18 or 19 wherein the solvent is ethyl alcohol, the substrate is frosted cellulose acetate which is 0.005" thick, and the colorant is india ink.

27. A method according to any one of claims 18 or 19 wherein step (c) further comprises contacting printing the continuous tone substrate of step (b) onto a plurality of print plates, each being printed with a different exposure time, and wherein step (d) further comprises printing prints from the plurality of prints produced in step (c) by overprinting each print with each of the plates so produced using differing inks.

28. A method according to claim 27 wherein the solvent is ethyl alcohol, the substrate is frosted cellulose acetate which is 0.005" thick, and the colorant is india ink.

29. A method according to claim 17 further comprising, before step (a), producing an opaque pattern on said substrate whereupon subsequent steps (a) and (b) produce continuous tone gradations superimposed over the opaque pattern.

30. A method according to claim 17 further comprising, between steps (b) and (c), producing an opaque pattern on the substrate whereupon the opaque pattern is superimposed over the continuous tone gradations.

31. A method according to any one of claims 29 or 30 wherein the opaque pattern is a line drawing.

32. A method according to any one of claims 29 or 30 wherein step (c) further comprises contact printing the continuous tone substrate of step (b) onto a plurality of print plates, each being printed with a different exposure time, and wherein step (d) further comprises printing prints from the plurality of prints produced in step (c) by overprinting each print with each of the plates so produced using differing inks.

33. A method according to claim 32 wherein the opaque pattern is a line drawing.

34. A method of producing prints having continuous tone gradations comprising:
   (a) mixing a colorant and a solvent;
   (b) selectively placing the mixture on a semi-opaque substrate having a surface wherein the surface of the substrate is altered by the solvent such that the substrate is able to hold the colorant, thereby producing continuous tone gradations;
   (c) transferring an image of the continuous tone gradation substrate of step (b) without interposition of a screen onto a print plate; and
   (d) printing prints from the print plate.

35. A method according to claim 34 wherein step (c) comprises contact printing the continuous tone gradation substrate of step (b) onto the print plate.

36. A method according to claim 34 wherein step (c) comprises contact printing the continuous tone gradation substrate of step (b) onto a photosensitive transparent second substrate to produce a negative and contact printing the negative onto the print plate.

37. A method according to one of claims 35 or 36 wherein the solvent is selected from the group consisting of an alcohol and an ether.

38. A method according to claim 37 wherein the alcohol is selected from the group consisting of methyl, ethyl, propyl, isopropyl, n-butyl, sec-butyl, iso-butyl, tert-butyl and benzyl.

39. A method according to claim 38 wherein the alcohol is ethyl.

40. A method according to one of claims 35 or 36 wherein the substrate is a plastic selected from the group consisting of cellulose acetate, polypropylene, polyethylene, polystyrene, polymethylmethacrylate and polyphenol.

41. A method according to claim 40 wherein the plastic is cellulose acetate frosted on at least one side and is up to 0.010 inches thick.

42. A method according to claim 34 wherein the colorant is ink.

43. A method according to any one of claims 35 or 36 wherein the solvent is ethyl alcohol, the substrate is frosted cellulose acetate which is 0.005" thick and the colorant is india ink.

44. A method according to any one of claims 35 or 36 wherein step (c) further comprises contact printing the continuous tone substrate of step (b) onto a plurality of print plates, each being printed with a different exposure time, and wherein step (d) further comprises printing prints from the plurality of prints produced in step (c) by overprinting each print with each of the plates so produced using differing inks.

45. A method according to claim 44 wherein the solvent is ethyl alcohol, the substrate is frosted cellulose acetate which is 0.005" thick, and the colorant is india ink.

46. A method according to claim 34 further comprising, before step (a) producing an opaque pattern on said substrate whereupon subsequent steps (a) and (b) produce continuous tone gradations superimposed over the opaque pattern.

47. A method according to claim 34 further comprising, between steps (b) and (c), producing an opaque pattern on the substrate whereupon the opaque pattern is superimposed over the continuous tone gradations.

48. A method according to any one of claims 46 or 47 wherein the opaque pattern is a line drawing.

49. A method according to any one of claims 46 or 47 wherein step (c) further comprises contact printing the continuous tone substrate of step (b) onto a plurality of print plates, each being printed with a different exposure time, and wherein step (d) further comprises printing prints from the plurality of prints produced in step (c) by overprinting each print with each of the plates so produced using differing inks.

50. A method according to claim 49 wherein the opaque pattern is a line drawing.

51. A method of producing prints having continuous gradations comprising:
   (a) selectively placing solvent on a semi-opaque substrate having a surface wherein the surface of the substrate is altered such that the substrate is able to hold a colorant; and
   (b) placing colorant on the areas of the substrate treated in step (a) prior to the solvent evaporating, thereby producing continuous tone gradations.

52. A method of producing prints having continuous tone gradations comprising:
   (a) selectively placing a colorant on a semi-opaque substrate having a surface; and
   (b) placing a solvent on the areas of the substrate treated in step (a) prior to the colorant drying wherein the surface of the substrate is altered such that the substrate is able to hold the colorant, thereby producing continuous tones.

* * * * *